(12) United States Patent
Tan et al.

(10) Patent No.: US 11,827,202 B2
(45) Date of Patent: Nov. 28, 2023

(54) METHOD AND APPARATUS FOR SIMULATING VEHICLE, AND MEDIUM

(71) Applicant: BEIJING BAIDU NETCOM SCIENCE AND TECHNOLOGY CO., LTD., Beijing (CN)

(72) Inventors: Yinong Tan, Beijing (CN); Xiao Cui, Beijing (CN); Dingfeng Guo, Beijing (CN); Zhenguang Zhu, Beijing (CN)

(73) Assignee: Beijing Baidu Netcom Science and Technology Co., LTD., Beijing (CN)

( * ) Notice: Subject to any disclaimer, the term of this patent is extended or adjusted under 35 U.S.C. 154(b) by 231 days.

(21) Appl. No.: 17/189,899

(22) Filed: Mar. 2, 2021

(65) Prior Publication Data
US 2021/0276539 A1   Sep. 9, 2021

(30) Foreign Application Priority Data

Mar. 3, 2020   (CN) .......................... 202010139855.8

(51) Int. Cl.
*B60W 30/02*   (2012.01)
*B60W 10/04*   (2006.01)
(Continued)

(52) U.S. Cl.
CPC ............ *B60W 30/02* (2013.01); *B60W 10/04* (2013.01); *B60W 10/18* (2013.01); *B60W 40/10* (2013.01);
(Continued)

(58) Field of Classification Search
CPC .. B60W 10/04; B60W 10/18; B60W 2520/26; B60W 2530/20; B60W 2540/10;
(Continued)

(56) References Cited

U.S. PATENT DOCUMENTS 6,370,467 B1 * 4/2002 Kimbrough ......... B60T 8/17616
701/84
9,340,211 B1 * 5/2016 Singh .................... B60T 8/1725
(Continued)

FOREIGN PATENT DOCUMENTS

CN   106502736 A   3/2017
CN   111090364 A   5/2020
(Continued)

OTHER PUBLICATIONS

Extended European Search Report for Application No. 21160133.1, dated Jun. 21, 2021, 8 pages.
(Continued)

*Primary Examiner* — Babar Sarwar
(74) *Attorney, Agent, or Firm* — Lippes Mathias LLP

(57) ABSTRACT

The disclosure discloses a method and an apparatus for simulating a vehicle. The detailed implementation includes: determining, by a tire dynamics module, a tire translational force at a current moment based on a control instruction issued by an upper planning module and motion data of a vehicle body and a tire normal load outputted by a vehicle body dynamics module at a previous moment; and determining, by the vehicle body dynamics module, motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment.

20 Claims, 3 Drawing Sheets

(51) Int. Cl.
*B60W 10/18* (2012.01)
*B60W 40/10* (2012.01)

(52) U.S. Cl.
CPC ..... *B60W 2520/26* (2013.01); *B60W 2530/20* (2013.01); *B60W 2540/10* (2013.01); *B60W 2540/12* (2013.01); *B60W 2540/16* (2013.01); *B60W 2540/18* (2013.01)

(58) Field of Classification Search
CPC ......... B60W 2540/12; B60W 2540/16; B60W 2540/18; B60W 30/02; B60W 40/10; G06F 30/15; G06F 30/20
See application file for complete search history.

(56) References Cited

U.S. PATENT DOCUMENTS

| | | | | |
|---|---|---|---|---|
| 2006/0217867 | A1* | 9/2006 | Ono | B62D 6/003 701/41 |
| 2006/0276944 | A1* | 12/2006 | Yasui | B60T 8/1755 701/37 |
| 2008/0015754 | A1* | 1/2008 | Hac | B62D 6/003 701/1 |
| 2008/0208406 | A1* | 8/2008 | Chen | B62D 7/159 701/41 |
| 2008/0243327 | A1* | 10/2008 | Bujak | B60W 30/12 340/442 |
| 2009/0177346 | A1* | 7/2009 | Hac | B60W 40/13 701/31.4 |
| 2010/0131144 | A1* | 5/2010 | Ryu | B60W 40/103 701/79 |
| 2011/0307129 | A1* | 12/2011 | Yu | B60W 30/02 701/22 |
| 2012/0055744 | A1* | 3/2012 | Chen | B60W 30/02 188/106 P |
| 2012/0059547 | A1* | 3/2012 | Chen | B60W 10/22 701/41 |
| 2013/0325283 | A1* | 12/2013 | Rylander | G06F 17/00 701/82 |
| 2015/0057951 | A1* | 2/2015 | Stalnaker | G06F 30/15 703/2 |
| 2015/0097861 | A1* | 4/2015 | Alaniz | G06F 3/011 345/633 |
| 2015/0120106 | A1* | 4/2015 | Yu | B60W 30/02 701/22 |
| 2015/0219529 | A1* | 8/2015 | Akiyama | G01M 15/00 73/115.01 |
| 2018/0105181 | A1* | 4/2018 | Skold | B60T 8/17551 |
| 2018/0273046 | A1* | 9/2018 | Berntorp | B60T 8/172 |
| 2018/0319404 | A1* | 11/2018 | Jonasson | B60T 8/172 |
| 2018/0334166 | A1* | 11/2018 | Zhu | B60W 30/12 |
| 2019/0389473 | A1* | 12/2019 | Chen | B60T 8/3205 |
| 2020/0317018 | A1* | 10/2020 | Nong | B60G 17/01908 |
| 2020/0324763 | A1* | 10/2020 | Switkes | G08G 1/161 |
| 2021/0046932 | A1* | 2/2021 | Kegelman | G08G 1/22 |
| 2021/0261145 | A1* | 8/2021 | Berntorp | B60W 50/06 |
| 2021/0309312 | A1* | 10/2021 | Wang | B62L 3/06 |
| 2022/0306117 | A1* | 9/2022 | Laine | B60T 8/1725 |

FOREIGN PATENT DOCUMENTS

| | | | | |
|---|---|---|---|---|
| CN | 111131352 A | | 5/2020 | |
| JP | 2009276304 A | * | 11/2009 | ........ G01M 17/0074 |
| JP | 2018202894 A | | 12/2018 | |
| JP | 2019537025 A | | 12/2019 | |
| JP | 2020511711 A | | 4/2020 | |

OTHER PUBLICATIONS

Matlab Expo, Jan. 1, 2018, Korea, Subtrack 2, Vehicle Dynamics Blockset, 46 pages.
Bengt Jacobson, "Vehicle Dynamics Compendium for Course MMF062", Vehicle Dynamics Group, Division of Vehicle and Autonomous Systems, Department of Applied Mechanics, Chalmers University of Technology, Jan. 1, 2015, 268 pages.
Office Action for Japanese Application No. 2021-033509, dated Feb. 15, 2022, 5 pages.
Office Action JP2022-054751 dated Apr. 4, 2023.
Office Action EP22 16 9874.9 dated Jan. 20, 2023.

* cited by examiner

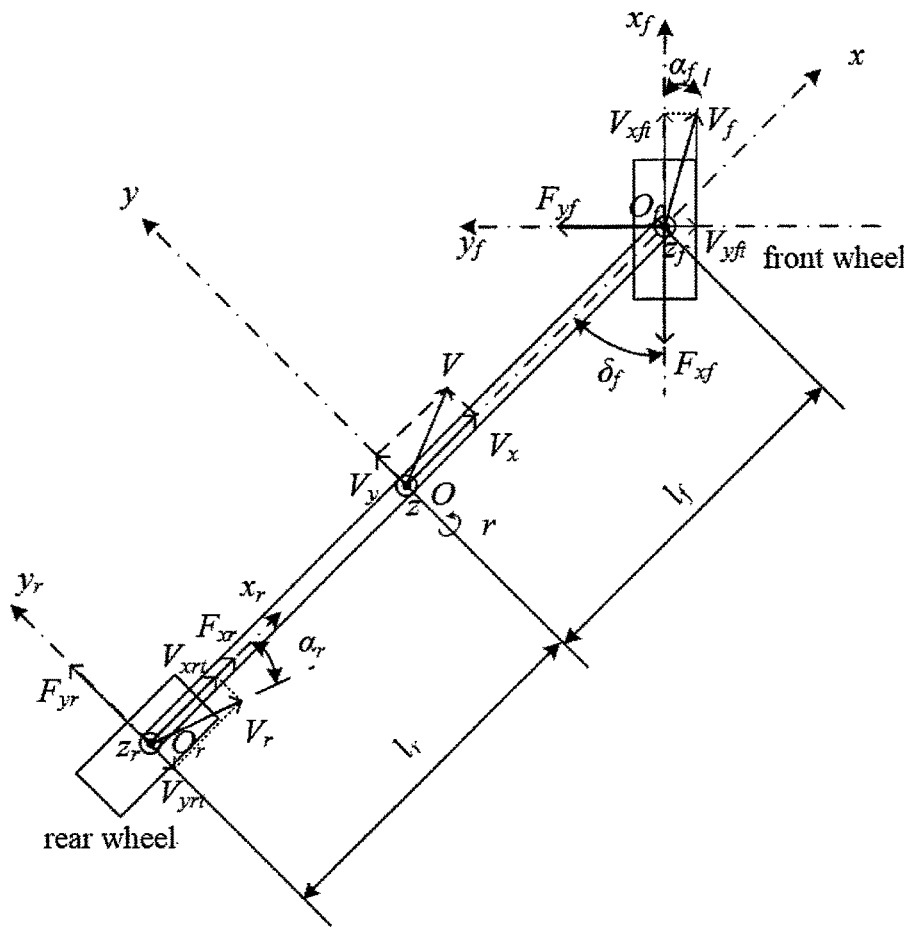

FIG. 2A

| converting, by the tire dynamics module and/or the vehicle body dynamics module, the control instruction into a vehicle control parameter based on a preset calibration table of control parameters, the vehicle control parameter comprising driving torque and/or braking torque | S201 |

| determining, by a tire dynamics module, a tire translational force at a current moment based on a control instruction issued by an upper planning module and motion data of a vehicle body and a tire normal load outputted by a vehicle body dynamics module at a previous moment | S202 |

| determining, by the vehicle body dynamics module, motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment | S203 |

FIG. 2B

METHOD AND APPARATUS FOR SIMULATING VEHICLE, AND MEDIUM

CROSS-REFERENCE TO RELATED APPLICATION

The present application is based upon and claims priority to Chinese Patent Application No. 202010139855.8, filed on Mar. 3, 2020, the entirety contents of which are incorporated herein by reference.

FIELD

The disclosure relates to a field of data processing technologies and particularly to a field of automatic driving technologies, and particularly relates to a method and an apparatus for simulating a vehicle, and a medium.

BACKGROUND

An unmanned vehicle is a kind of intelligent vehicles, also referred as a wheeled mobile robot. The unmanned vehicle senses road environment through an on-board sensing system, automatically plans a driving route, and is controlled to reach a predetermined destination.

With the advancement of technologies, a performance of the unmanned vehicle is constantly optimized. The performance of the unmanned vehicle generally needs to be tested when a new vehicle feature is applied to the unmanned vehicle. The test includes a simulation test and a road test.

SUMMARY

Embodiments of the disclosure provide a method and an apparatus for simulating a vehicle, and a medium.

Embodiments of the disclosure provide a method for simulating a vehicle. The method includes: determining, by a tire dynamics module, a tire translational force at a current moment based on a control instruction issued by an upper planning module and motion data of a vehicle body and a tire normal load outputted by a vehicle body dynamics module at a previous moment; and determining, by the vehicle body dynamics module, motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment.

Embodiments of the disclosure also provide an apparatus for simulating a vehicle. The apparatus includes: one or more processors; a memory storing instructions executable by the one or more processors; in which the one or more processors are configured to: determine a tire translational force at a current moment based on a control instruction issued by an upper planning module and motion data of a vehicle body and a tire normal load outputted by the vehicle body dynamics module at a previous moment; determine motion data of the vehicle body and a tire normal load at the current moment based on the control instruction and the tire translational force at the current moment. The motion data of the vehicle body at the current moment is used for vehicle simulation. The tire normal load at the current moment is used to determine a tire translational force at a next moment.

Embodiments of the disclosure also provide a non-transitory computer readable storage medium having computer instructions stored thereon. The computer instructions are configured to cause a computer to execute a method for simulating a vehicle. The method includes: determining, by a tire dynamics module, a tire translational force at a current moment based on a control instruction issued by an upper planning module and motion data of a vehicle body and a tire normal load outputted by a vehicle body dynamics module at a previous moment; and determining, by the vehicle body dynamics module, motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment.

Other effects of the above alternative modes will be explained in the following with specific embodiments.

BRIEF DESCRIPTION OF THE DRAWINGS

The accompanying drawings are used for better understanding the solution and do not constitute a limitation of the disclosure.

FIG. 2A is a schematic diagram illustrating a vehicle body model in a horizontal direction according to Embodiment two of the disclosure.

FIG. 2B is a flow chart illustrating a method for simulating a vehicle according to Embodiment two of the disclosure.

DETAILED DESCRIPTION

Description will be made below to exemplary embodiments of the disclosure with reference to accompanying drawings, which includes various details of embodiments of the disclosure to facilitate understanding and should be regarded as merely examples. Therefore, it should be recognized by the skilled in the art that various changes and modifications may be made to the embodiments described herein without departing from the scope and spirit of the disclosure. Meanwhile, for clarity and conciseness, descriptions for well-known functions and structures are omitted in the following description.

In the related art, when simulation is performed on the unmanned vehicle, the simulation is mainly realized by directly issuing vehicle status information such as planning speed information and location information, without considering an actual implementation of the unmanned vehicle. Therefore, there is a large difference between a simulation effect and an actual operation result of the unmanned vehicle, thereby causing a higher time cost and a higher economic cost of a vehicle test.

In order to clearly describe technical solutions of subsequent embodiments, exemplified description is first made to a software structure of a system for simulating a vehicle according to embodiments of the disclosure.

Figure 1A:
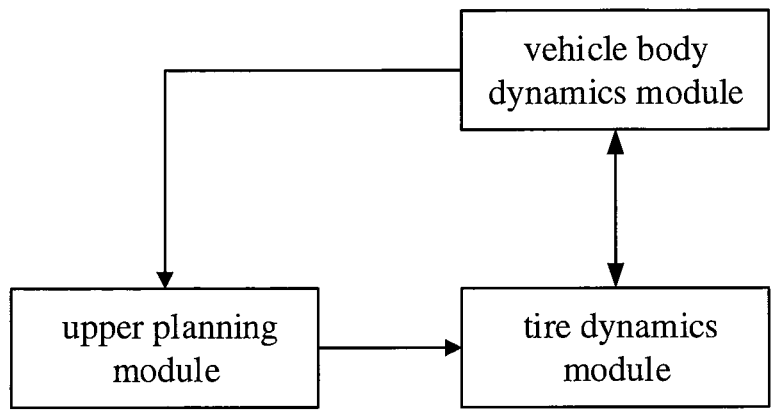
FIG. 1A is a block diagram illustrating a software structure of a system for simulating a vehicle according to an embodiment of the disclosure.

A system for simulating the vehicle illustrated in FIG. 1 includes an upper planning module 10, a tire dynamics module 20, and a vehicle body dynamics module 30.

The upper planning module 10 is configured to issue a control instruction to the tire dynamics module 20 and the vehicle body dynamics module 30 based on a simulation requirement.

The tire dynamics module 20 and the vehicle body dynamics module 30 are configured to determine motion data of a vehicle body based on the control instruction according to a pre-constructed tire model and a pre-constructed vehicle body model, and to feed the motion data of the vehicle body back to the upper planning module 10.

The upper planning module 10 is also configured to control the vehicle in a virtual simulation platform to perform simulation operation of the vehicle based on the motion data of the vehicle body.

Embodiment One

Figure 1B:
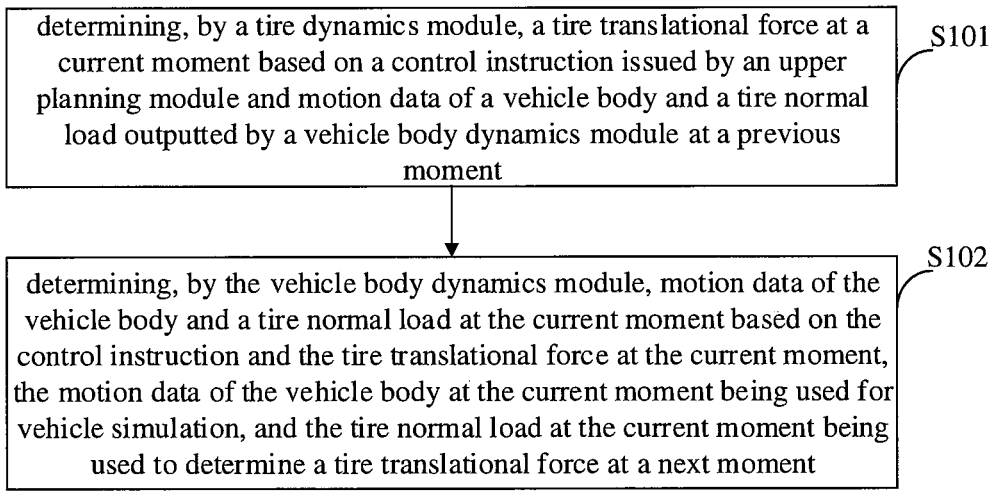
FIG. 1B is a flow chart illustrating a method for simulating a vehicle according to Embodiment one of the disclosure.

FIG. 1B is a flow chart illustrating a method for simulating a vehicle according to Embodiment one of the disclosure. Embodiments of the disclosure are applicable to a condition where an unmanned vehicle is simulated and tested. The method is executed by an apparatus for simulating a vehicle. The apparatus is implemented by software and/or hardware, and is specifically configured in an electronic device. The electronic device may be integrated into a control system of the vehicle.

The method for simulating the vehicle illustrated in FIG. 1B includes the following.

At block S101, a tire translational force at a current moment is determined by a tire dynamics module based on a control instruction issued by an upper planning module and motion data of a vehicle body and a tire normal load outputted by a vehicle body dynamics module at a previous moment.

The control instruction includes at least one of: a gear position, a driving pedal opening, a braking pedal opening, and a steering angle of a steering wheel, which is configured to simulate a condition where control is performed on a vehicle while a driver drives the vehicle.

The tire translational force includes a tire lateral force and a tire longitudinal force. The tire lateral force is used to influence a driving direction of the vehicle, and may be controlled by issuing a control instruction including the steering angle of the steering wheel. The tire longitudinal force may affect a running speed of the vehicle, and perform vehicle acceleration and deceleration control by issuing a control instruction including the gear position, the driving pedal opening and the braking pedal opening.

With a center of a tire as an origin, a longitudinal direction is a horizontal forward direction along a rotation direction of the tire, and a lateral direction is a direction where a surface of the tire points to the left and is perpendicular to the longitudinal direction.

It may be understood that, a front wheel and a rear wheel correspond to different lateral directions and different longitudinal directions when the vehicle turns. Therefore, the tire normal load and the tire translational force need to be calculated separately for the front wheel and the rear wheel.

At block S102, motion data of the vehicle body and a tire normal load at the current moment are determined by the vehicle body dynamics module based on the control instruction and the tire translational force at the current moment. The motion data of the vehicle body at the current moment is used for vehicle simulation, and the tire normal load at the current moment is used to determine a tire translational force at a next moment.

The motion data of the vehicle body includes at least one of: an acceleration of the vehicle body, a velocity of the vehicle body, a position of the vehicle body, a yaw angle of the vehicle body, and the like The tire normal load represents a force of the tire in a vertical direction.

Exemplarily, the vehicle body dynamics module determines the motion data of the vehicle body and the tire normal load at the current moment based on the control instruction and the tire translational force at the current moment outputted by the tire dynamics module.

In an alternative implementation of embodiments of the disclosure, the vehicle body dynamics module also sends the motion data of the vehicle body at the current moment to the upper planning module after determining the tire normal load and the motion data of the vehicle body at the current moment, thereby enabling the upper planning module performing the vehicle simulation based on the motion data of the vehicle body at the current moment.

Generally, a coordinate system employed by the vehicle body dynamics module is different from a coordinate system employed by the upper planning module. In order to reduce the amount of data calculation in the upper planning module, realize transparent control of the upper planning module and direct reuse of the upper planning module, the motion data of the vehicle body at the current moment is transformed through the vehicle body dynamics module from a first coordinate system employed by the vehicle body dynamics module into a second coordinate system employed by the upper planning module before the motion data of the vehicle body at the current moment is sent by the vehicle body dynamics module to the upper planning module.

The first coordinate system may be a vehicle body coordinate system, and the second coordinate system may be a world coordinate system.

In the vehicle body coordinate system, a center of mass of the vehicle is taken as an origin, a direction which the head of the vehicle points to is taken as an x axis direction, a direction vertical to the left of the head of the vehicle is taken as a y axis direction, and the vertical direction passing through the center of mass of the vehicle is taken as a z axis direction.

In another alternative implementation of embodiments of the disclosure, in order to determine the tire translational force at the next moment, after determining the motion data of the vehicle body and the tire normal load at the current moment, the method also includes: sending, by the vehicle body dynamics module, the tire normal load at the current moment to the tire dynamics module; and determining, by the tire dynamics module, the tire translational force at the next moment based on the tire normal load at the current moment.

It should be understood that, when the tire translational force is determined by the tire dynamics module, and the tire normal load and the motion data of the vehicle body are determined by the vehicle body dynamics module, a vector needs to be calculated based on a set algorithm model. However, the control instruction is merely used to represent a simulation quantity of a module (such as a throttle, a brake, a gear or a steering wheel) operated in the vehicle. Therefore, the control instruction needs to be converted into data which may be recognized by the tire dynamics module and the vehicle body dynamics module.

To achieve the above objectives, the control instruction may also be converted into a vehicle control parameter based on a preset calibration table of control parameters through a preprocessing module while the upper planning module issues the control instruction to the tire dynamics module and the vehicle body dynamics module. The vehicle control parameter includes driving torque and/or braking torque. Correspondingly, the preprocessing module sends the vehicle control parameter to the tire dynamics module and the vehicle body dynamics module for using.

It may be understood that, in order to reduce the number of modules in the control system, the preprocessing module may also be incorporated into the tire dynamics module and/or the vehicle body dynamics module, such that the control instruction may be converted into the vehicle control parameter based on the preset calibration table of control parameters through the tire dynamics module and/or the vehicle body dynamics module. When the tire dynamics module or the vehicle body dynamics module is configured to convert the control instruction, the converted vehicle control parameter is transmitted to another dynamics module for using.

With embodiments of the disclosure, the tire translational force at the current moment is determined by the tire dynamics module based on the control instruction issued by the upper planning module and the motion data of the vehicle body and the tire normal load outputted by the vehicle body dynamics module at the previous moment. The motion data of the vehicle body and the tire normal load at the current moment are determined by the vehicle body dynamics module based on the control instruction and the tire translational force at the current moment. The motion data of the vehicle body at the current moment is used for vehicle simulation, and the tire normal load at the current moment is used to determine the tire translational force at the next moment. With the above technical solution, the control instruction issued by the upper planning module is processed by the tire dynamics module and the vehicle body dynamics module, data interaction is performed between the tire dynamics module and the vehicle body dynamics module, and then the tire translational force, the motion data of the vehicle body and the tire normal load are determined. In this way, the combination of the dynamic model and an existing integrated framework of the unmanned vehicle is realized. A complete closed loop is formed for a simulation test of the vehicle. The accuracy of a result of the simulation test of the vehicle is improved, and a matching degree between the result of the simulation test and a result of a road test is further improved. The simulation test may replace the road test when a new vehicle feature is introduced into the unmanned vehicle, thereby improving the test efficiency of the vehicle and reducing the test cost of the vehicle. Meanwhile, the vehicle body dynamics module and the tire dynamics module are configured to determine the tire translational force, the motion data of the vehicle body and the tire normal load respectively. Different dynamics modules perform operations respectively and complement each other at the same time, thereby implementing the decoupling between code segments in the dynamic model.

Embodiment Two

FIG. 2B is a schematic diagram illustrating a vehicle body model in a horizontal direction according to Embodiment two of the disclosure. This embodiment of the disclosure is further optimized and improved on the basis of the technical solution of the above embodiments.

Further, before the operation "determining the tire translational force at the current moment based on the control instruction and the motion data of the vehicle body and the tire normal load outputted by the vehicle body dynamics module at the previous moment", the operation "converting, by the tire dynamics module and/or the vehicle body dynamics module, the control instruction into a vehicle control parameter based on a preset calibration table of control parameters, the vehicle control parameter comprising driving torque and/or braking torque" is performed, which provides data support for subsequently determining the motion data of the vehicle body at the current moment.

Description will be made in detail to embodiments of the disclosure with reference to a vehicle body model in the horizontal direction with three degrees of freedom (DOF) illustrated in FIG. 2A. The degree of freedom is used to represent the number of independent coordinates. A lateral translation of the vehicle, a longitudinal translation of the vehicle, and a rotation of the vehicle around the z axis provide three degrees of freedom.

Embodiments of the disclosure involve three coordinate systems, which are respectively a tire coordinate system, a vehicle body coordinate system, and a world coordinate system.

The tire dynamics module performs data computation based on the tire coordinate system. Taking a front wheel as an example, the tire coordinate system of the front wheel is represented by $O_f x_f y_f z_f$, where, $O_f$ represents the center of the front wheel; $x_f$ represents a direction which the front wheel rotates horizontally forward; $y_f$ represents a direction which the left of the surface of the front wheel points to and is perpendicular to $x_f$; and $z_f$ represents a direction which follows the right-hand rule and goes up vertically. Correspondingly, the tire coordinate system of the rear wheel is represented by $O_r x_r y_r z_r$, where, $O_r$ represents the center of the rear wheel; $x_r$ represents a direction which the rear wheel rotates horizontally forward; $y_r$ represents a direction which the left of the surface of the rear wheel points to and is perpendicular to $x_r$; and $z_r$ represents a direction which follows the right-hand rule and goes up vertically.

The vehicle body dynamics module performs data computation based on the vehicle body coordinate system. The vehicle body coordinate system is represented by Oxyz, where O represents a center of mass of the vehicle; a direction which the head of the vehicle points to is the x-axis direction; a direction vertical to the left side of the head of the vehicle is taken as the y axis direction; and a vertical direction is taken as the z-axis direction.

The method illustrated in FIG. 2B includes the following.

At block S201, the control instruction is converted into the vehicle control parameter by the tire dynamics module and/or the vehicle body dynamics module based on the preset calibration table of control parameters.

The vehicle control parameter includes the driving torque and/or the braking torque.

Exemplarily, when the motion data of the vehicle body at the current moment is subsequently determined, the tire dynamics module determines the tire translational force first, and then the vehicle body dynamics module determines the motion data of the vehicle body based on the tire translational force determined by the tire dynamics module. Therefore, in order to reduce the amount of data interaction between the upper planning module and the two dynamics modules, the tire dynamics module generally converts the control instruction into the vehicle control parameter, and the vehicle body dynamics module obtains data from the tire dynamics module when needing the data.

At block S202, the tire translational force at the current moment is determined by the tire dynamics module based on the control instruction issued by the upper planning module and the motion data of the vehicle body and the tire normal load outputted by the vehicle body dynamics module at the previous moment.

The tire dynamics module determines the tire translational force at the current moment based on a tire model. The tire coordinate system is used in the tire model.

Exemplarily, determining the tire translational force at the current moment based on the control instruction, the motion data of the vehicle body and the tire normal load outputted by the vehicle body dynamics module at the previous moment may include: determining a tire motion parameter at the current moment based on the driving torque, the braking torque, a tire rotation radius, a tire pressure, and a velocity of the vehicle body and the tire normal load outputted by the vehicle body dynamics module at the previous moment; determining a tire longitudinal sliding rate at the current moment based on the tire rotation radius, the tire motion parameter and the velocity of the vehicle body outputted by the vehicle body dynamics module at the previous moment, and determining a tire longitudinal force at the current moment based on the tire longitudinal sliding rate and the tire normal load outputted by the vehicle body dynamics module at the previous moment; and determining a tire lateral slip angle at the current moment based on a tire wheelbase, the tire motion parameter and the vehicle body velocity outputted by the vehicle body dynamics module at the previous moment, and determining a tire lateral force at the current moment based on the tire lateral slip angle and the tire normal load outputted by the vehicle body dynamics module at the previous moment. The tire translational force includes the tire longitudinal force and the tire lateral force.

The tire motion parameter may be a tire rotational acceleration or a tire rotational velocity.

Exemplarily, a velocity component $V_{xft}$ of the front wheel in the $x_f$ direction, a velocity component $V_{yft}$ of the front wheel in the $y_f$ direction, a velocity component $V_{xft}$ of the rear wheel in the $x_r$ direction and a velocity component $V_{yrt}$ of the rear wheel in the $y_r$ direction are determined by the following formula:

$$\begin{cases} V_{xft} = V_x \cos\delta_f + (V_y + r \cdot l_f)\sin\delta_f \\ V_{yft} = -V_x \cos\delta_f + (V_y - r \cdot l_f)\cos\delta_f \end{cases}$$

$$\begin{cases} V_{xrt} = V_x \cos\delta_r + (V_y - r \cdot l_r)\sin\delta_r \\ V_{yrt} = -V_x \sin\delta_r + (V_y - r \cdot l_r)\cos\delta_r \end{cases},$$

where, $V_x$ represents the velocity component of the vehicle body in the x axis, and $V_y$ represents the velocity component of the vehicle body in the y axis outputted by the vehicle body dynamics module at the previous moment; $\delta_f$ represents an angle of the front wheel of the vehicle, and $\delta_r$ represents an angle of the rear wheel of the vehicle, which are determined by a ratio of an angle of the steering wheel to a transmitting ratio of the steering wheel to the tire, the transmitting ratio being a constant; r represents a yaw angle velocity of the vehicle body at the previous moment; and $l_f$ represents a wheelbase of the front wheel, and $l_r$ represents a wheel track of the rear wheel.

Exemplarily, the tire rotation acceleration includes a rotation acceleration $\dot{\omega}_f$ of the front wheel and a rotation acceleration $\dot{\omega}_r$ of the rear wheel. The tire rotational velocity includes a rotation velocity $\omega_f$ of the front wheel and a rotation velocity for of the rear wheel. The tire rotational acceleration and the tire rotational velocity are determined by the following formula:

$$\begin{cases} T_{if} = T_{af} - T_{bf} + T_{df} \\ T_{df} = F_{xf}R_e + M_{yf} \\ M_{yf} = R_e\{a + b|V_{xft}| + cV_{xft}^2\}\{F_{zf}^\beta p_i^\alpha\}\tanh(4V_{xft}) \\ J\dot{\omega}_f = T_{if} \\ \omega_f = \int \dot{\omega}_f dt + \omega_{f(t-1)} \end{cases} ; \text{ and}$$

$$\begin{cases} T_{ir} = T_{ar} - T_{br} + T_{dr} \\ T_{dr} = F_{xr}R_e + M_{yr} \\ M_{yr} = R_e\{a + b|V_{xrt}| + cV_{xrt}^2\}\{F_{zr}^\beta p_i^\alpha\}\tanh(4V_{xrt}) \\ J\dot{\omega}_r = T_{ir} \\ \omega_r = \int \dot{\omega}_r dt + \omega_{r(t-1)} \end{cases}.$$

$T_{af}$ represents a driving torque of the front wheel, and $T_{ar}$ represents a driving torque of the rear wheel. $T_{bf}$ represents a braking torque of the front wheel, and $T_{br}$ represents a braking torque of the rear wheel. $R_e$ represents the tire rotation radius. $p_i$ represents the tire pressure. $F_{zf}$ represents a tire normal load of the front wheel, and $F_{zr}$ represents a tire normal load of the rear wheel, which are respectively outputted by the vehicle body dynamics module at the previous moment. a, b, c, α, and β are constants. $M_{yf}$ represents a rolling friction torque of the front wheel, and $M_{yr}$ represents a rolling friction torque of the rear wheel. $\omega_{f(t-1)}$ represents a rotational speed of the front wheel at the previous moment, and $\omega_{r(t-1)}$ represents a rotational speed of the rear wheel at the previous moment. $F_{xf}$ represents a longitudinal force of the front wheel, and $F_{xr}$ represents a longitudinal force of the rear wheel, which are included in tire longitudinal force $F_x$ at the previous moment.

Exemplarily, v=0.01, b=0, c=0, a=0, and β=1.

It should be noted that, $T_{af}$ and $T_{ar}$ may assign the driving torques based on a vehicle driving mode, and $T_{bf}$ and $T_{br}$ may assign the braking torques based on a vehicle braking mode.

Exemplarily, the tire longitudinal sliding rate includes a longitudinal sliding rate $K_f$ of the front wheel, and a longitudinal sliding rate $K_r$ of the rear wheel. The tire longitudinal sliding rate at the current moment is determined by employing the following formula:

$$\begin{cases} \kappa_f = (\omega_f \times R_e - V_{xft})/\max(\omega_f \times R_e, V_{xft}) \\ \kappa_r = (\omega_r \times R_e - V_{xrt})/\max(\omega_r \times R_e, V_{xrt}) \end{cases}.$$

Exemplarily, the tire longitudinal force includes a longitudinal force $F_{xf}$ of the front wheel, and a longitudinal force $F_{xr}$ of the rear wheel. The tire longitudinal force at the current moment is determined by employing the following formula:

$$\begin{cases} F_{xf} = F(\kappa_f, F_{zf}) \\ F_{xr} = F(\kappa_r, F_{zr}) \end{cases},$$

where, F( ) represents a first formula when the tire longitudinal force is calculated by a magic formula; $F_{zf}$ represents a normal load of the front wheel at the previous moment; and $F_{zr}$ represents a normal load of the rear wheel at the previous moment.

Exemplarily, the tire lateral slip angle includes a lateral slip angle $\alpha_f$ of the front wheel, and a lateral slip angle $\alpha_r$ of the rear wheel. The tire lateral slip angle at the current moment is determined by employing the following formula:

$$\begin{cases} \alpha_f = \arctan(V_{yft}/V_{xft}) \\ \alpha_r = \arctan(V_{yrt}/V_{xrt}) \end{cases},$$

Exemplarily, the tire lateral force includes a lateral force $F_{yf}$ of the front wheel and a lateral force $F_{yr}$ of the rear wheel. The tire lateral force at the current moment is determined by employing the following formula:

$$\begin{cases} F_{yf} = G(\alpha_f, F_{zf}) \\ F_{yr} = G(\alpha_r, F_{zr}) \end{cases},$$

where, G( ) represents a second formula when the tire lateral force is calculated by the magic formula. The first formula is different from the second formula.

At block S203, the motion data of the vehicle body and the tire normal load at the current moment are determined by the vehicle body dynamics module based on the control instruction and the tire translational force at the current moment. The motion data of the vehicle body at the current moment is used for vehicle simulation, and the tire normal load at the current moment is used to determine a tire translational force at a next moment.

Exemplarily, determining the motion data of the vehicle body and the tire normal load at the current moment based on the control instruction and the tire translational force at the current moment may include: determining an air resistance and an air resistance torque based on a wind speed and a tire wheelbase; determining an acceleration of the vehicle body and a yaw angle acceleration of the vehicle body based on a vehicle rotating inertia, the air resistance, the air resistance torque and the tire translational force at the current moment outputted by the tire dynamics module; determining the tire normal load based on the acceleration of the vehicle body, the yaw angle acceleration of the vehicle body, the tire wheelbase, the air resistance and the air resistance torque at the current moment; and determining a motion parameter of the vehicle body based on the acceleration of the vehicle body and the yaw angle acceleration of the vehicle body.

The motion parameter of the vehicle body includes at least one of: the acceleration of the vehicle body, the velocity of the vehicle body, a position of the vehicle body, a yaw angle of the vehicle body, a yaw angle velocity of the vehicle body, and the yaw angle acceleration of the vehicle body.

It may be understood that the vehicle body dynamics module performs data computation based on the vehicle body coordinate system, while the tire dynamics module performs data operation based on the tire coordinate system. Therefore, coordinate transformation needs to be performed on the tire translational force outputted by the tire dynamics module at the current moment, i.e., the longitudinal force $F_{xf}$ of the front wheel, the longitudinal force $F_{xr}$ of the rear wheel, the lateral force $F_{yf}$ of the front wheel and the lateral force $F_{yr}$ of the rear wheel.

Exemplarily, the tire translational force is transformed from the tire coordinate system into the vehicle body coordinate system by employing the following formula:

$$\begin{cases} F'_{xf} = F_{xf}\cos(\delta_f) - F_{yf}\sin(\delta_f) \\ F'_{yf} = F_{xf}\sin(\delta_f) + F_{yf}\cos(\delta_f) \\ F'_{xr} = F_{xr}\cos(\delta_r) - F_{yr}\sin(\delta_r) \\ F'_{yr} = F_{xr}\sin(\delta_r) + F_{yr}\cos(\delta_r) \end{cases},$$

where, $F'_{xf}$ represents a longitudinal force of the front wheel in the vehicle body coordinate system, $F'_{xr}$ represents a longitudinal force of the rear wheel in the vehicle body coordinate system, $F'_{yf}$ represents a lateral force of the front wheel in the vehicle body coordinate system, and $F'_{yr}$ represents a lateral force of the rear wheel in the vehicle body coordinate system.

Exemplarily, the wind speed in the simulation requirement is transformed from the world coordinate system into the vehicle body coordinate system by employing the following formula:

$$\begin{cases} w_x = W_X\cos(\psi) + W_Y\sin(\psi) \\ w_y = W_Y\cos(\psi) - W_X\sin(\psi) \\ w_z = W_Z \end{cases},$$

where, $W_x$ represents a component of the wind speed in the X axis in the world coordinate system, $W_y$ represents a component of the wind speed in the Y axis in the world coordinate system, and $W_z$ represents a component of the wind speed in the Z axis in the world coordinate system; $w_x$ represents a component of the wind speed in the X axis in the vehicle body coordinate system, $w_y$ represents a component of the wind speed in the Y axis in the vehicle body coordinate system, and $w_z$ represents a component of the wind speed in the Z axis in the vehicle body coordinate system; and $\psi$ represents a yaw angle of the vehicle body.

Exemplarily, a relative wind speed $\overline{w}$ is determined by employing the following formula:

$$\overline{w} = \sqrt{(\dot{x}_{t-1} - w_x)^2 + (\dot{y}_{t-1} - w_y)^2 + (w_z)^2},$$

where, $\dot{x}_{t-1}$ represents a longitudinal component of the velocity of the vehicle body at the previous moment, and $\dot{y}_{t-1}$ represents a lateral component of the velocity of the vehicle body at the previous moment.

Exemplarily, in the vehicle body coordinate system, a component $F_{dx}$ of the air resistance in the x axis, a component $F_{dy}$ of the air resistance in the y axis, and a component $F_{dz}$ of the air resistance in the z axis are determined by employing the following formula:

$$\begin{cases} F_{dx} = -\dfrac{1}{2TR}C_d A_f P_{abs}(\overline{w})^2 \\ F_{dy} = -\dfrac{1}{2TR}C_s A_f P_{abs}(\overline{w})^2 \\ F_{dz} = -\dfrac{1}{2TR}C_l A_f P_{abs}(\overline{w})^2 \end{cases},$$

where, R represents an air constant; T represents an environment air temperature; $C_d$ represents an air resistance coefficient along the x axis in the vehicle body coordinate system, $C_s$ represents an air resistance coefficient along the y axis in the vehicle body coordinate system, and $C_l$ represents an air resistance coefficient along the z axis in the vehicle body coordinate system; $A_f$ represents a windward area of the vehicle; and $P_{abs}$ represents an absolute atmospheric pressure of the environment. The above parameters are known.

Exemplarily, the air resistance torque includes an air resistance pitching moment $M_{dp}$ rotating along the x axis and an air resistance yaw moment $M_{dy}$ rotating along the y axis in the vehicle body coordinate system. In the vehicle body coordinate system, the air resistance torque is determined by employing the following formula:

$$\begin{cases} M_{dp} = -\dfrac{1}{2TR} C_{pm} A_f P_{abs} (\overline{w})^2 (l_f + l_r) \\ M_{dy} = -\dfrac{1}{2TR} C_{ym} A_f P_{abs} (\overline{w})^2 (l_f + l_r) \end{cases},$$

where, $C_{pm}$ represents a torque resistance parameter of the air resistance rotating around the y axis in the vehicle body coordinate system, and $C_{ym}$ represents a torque resistance parameter of the air resistance rotating around the z axis in the vehicle body coordinate system; and $l_f$ represents a front wheel wheelbase of the vehicle, and $l_r$ represents a rear wheel wheelbase of the vehicle. The above parameters are known.

Exemplarily, in the vehicle body coordinate system, the acceleration ($\ddot{x}_t$, $\ddot{y}_t$) of the vehicle body and the yaw angle acceleration $\dot{r}_t$ of the vehicle body at the current moment are determined by employing the following formula:

$$\begin{cases} \ddot{y}_t = -\dot{x}_{t-1} r_{t-1} + \dfrac{F'_{yf} + F'_{yr} + F_{dy}}{m} \\ \dot{r}_t = \dfrac{l_f F'_{yf} - l_r F'_{yr} + M_{dy}}{I_{zz}} \\ \ddot{x}_t = \dot{y}_{t-1} r_{t-1} + \dfrac{F'_{xf} + F'_{xr} + F_{dx}}{m} \end{cases},$$

where, m represents a total mass of the vehicle; $r_{t-1}$ represents the yaw rate of the vehicle body at the previous moment; $\dot{x}_{t-1}$ represents a component of the velocity of the vehicle body in the x axis at the previous moment, and $\dot{y}_{t-1}$ represents a component of the velocity of the vehicle body in the y axis at the previous moment; $I_{zz}$ represents an inertia of the vehicle rotating along the Z axis; and $\ddot{x}_t$ represents a component of the acceleration of the vehicle body in the x axis at the current moment, and $\ddot{y}_t$ represents a component of the acceleration of the vehicle body in the y axis at the current moment.

Exemplarily, in the vehicle body coordinate system, the velocity ($\dot{x}_t$, $\dot{y}_t$) of the vehicle body, the position (x,y) of the vehicle body, the yaw angle velocity r of the vehicle body, and the yaw angle $\psi$ of the vehicle body at the current moment are determined by employing the following formula:

$$\begin{cases} \dot{x}_t = \int \ddot{x}_t dt + \dot{x}_{t-1} \\ \dot{y}_t = \int \ddot{y}_t dt + \dot{y}_{t-1} \\ r = \int \dot{r} dt + r_{t-1} \end{cases}$$

-continued $$\begin{cases} x_t = \int \dot{x}_t dt + x_{t-1} \\ y_t = \int \dot{y}_t dt + y_{t-1} \\ \psi = \int r dt + \psi_{t-1} \end{cases},$$

where, $\dot{x}_{t-1}$ represents a component of the velocity of the vehicle body in the x axis at the previous moment, and $\dot{y}_{t-1}$ represents a component of the velocity of the vehicle body in the y axis at the previous moment; $\dot{x}_t$ represents a component of the velocity of the vehicle body in the x axis at the current moment, and $\dot{y}_t$ represents a component of the velocity of the vehicle body in the y axis at the current moment; $x_{t-1}$ represents a component of the position of the vehicle body in the x axis at the previous moment, and $y_{t-1}$ represents a component of the position of the vehicle body in the y axis at the previous moment; and $x_t$ represents a component of the position of the vehicle body in the x axis at the current moment, and $y_t$ represents a component of the position of the vehicle body in the y axis at the current moment.

Exemplarily, the tire normal load includes a normal load $F_{zf}$ of the front wheel and a normal load $F_{zr}$ of the rear wheel. In the vehicle body coordinate system, the tire normal load $F_z$ at the current moment is determined by employing the following formula:

$$\begin{cases} F_{zf} = \dfrac{l_r mg - (\ddot{x}_t - \dot{y}_t r) mh + h F_{dx} + l_r F_{dz} - M_{dp}}{l_f + l_r} \\ F_{zr} = \dfrac{l_f mg + (\ddot{x}_t - \dot{y}_t r) mh - h F_{dx} + l_f F_{dz} + M_{dp}}{l_f + l_r} \end{cases},$$

where, h represents a height from a centroid of the vehicle to the ground.

With embodiments of the disclosure, before the tire translational force at the current moment is determined, the control instruction is converted into the vehicle control parameter based on the preset calibration table of control parameters by the tire dynamics module and/or the vehicle body dynamics module. In this way, simulation data that may be recognized by the vehicle may be converted into the data that may be used by the tire dynamics module and the vehicle body dynamics module, thereby providing data support for the tire dynamics module and the vehicle body dynamics module to determine the final motion data of the vehicle body.

Embodiment Three

Figure 3:
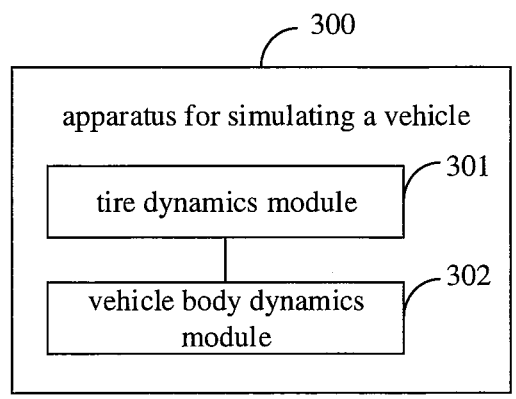
FIG. 3 is a block diagram illustrating an apparatus for simulating a vehicle according to Embodiment three of the disclosure.

FIG. 3 is a block diagram illustrating an apparatus for simulating a vehicle according to Embodiment three of the disclosure. Embodiments of the disclosure are applicable to a condition where an unmanned vehicle is simulated and tested. The apparatus is implemented by software and/or hardware, and is specifically configured in an electronic device. The electronic device may be integrated into a control system of the vehicle.

The apparatus 300 for simulating the vehicle illustrated in FIG. 3 includes a tire dynamics module 301 and a vehicle body dynamics module 302.

The tire dynamics module 301 is configured to determine a tire translational force at a current moment based on a control instruction issued by an upper planning module and motion data of a vehicle body and a tire normal load outputted by the vehicle body dynamics module 302 at a previous moment.

The vehicle body dynamics module 302 is configured to determine motion data of the vehicle body and a tire normal load at the current moment based on the control instruction and the tire translational force at the current moment. The motion data of the vehicle body at the current moment is used for vehicle simulation. The tire normal load at the current moment is used to determine a tire translational force at a next moment.

With embodiments of the disclosure, the tire translational force at the current moment is determined by the tire dynamics module based on the control instruction issued by the upper planning module and the motion data of the vehicle body and the tire normal load outputted by the vehicle body dynamics module at the previous moment. The motion data of the vehicle body and the tire normal load at the current moment are determined by the vehicle body dynamics module based on the control instruction and the tire translational force at the current moment. The motion data of the vehicle body at the current moment is used for vehicle simulation, and the tire normal load at the current moment is used to determine the tire translational force at the next moment. With the above technical solution, the control instruction issued by the upper planning module is processed by the tire dynamics module and the vehicle body dynamics module, data interaction is performed between the tire dynamics module and the vehicle body dynamics module, and then the tire translational force, the motion data of the vehicle body and the tire normal load are determined. In this way, the combination of the dynamic model and an existing integrated framework of the unmanned vehicle is realized. A complete closed loop is formed for a simulation test of the vehicle. The accuracy of a result of the simulation test of the vehicle is improved, and a matching degree between the result of the simulation test and a result of a road test is further improved. The simulation test may replace the road test when a new vehicle feature is introduced into the unmanned vehicle, thereby improving the test efficiency of the vehicle and reducing the test cost of the vehicle. Meanwhile, the vehicle body dynamics module and the tire dynamics module are configured to determine the tire translational force, the motion data of the vehicle body and the tire normal load respectively, thereby implementing the decoupling between code segments in the dynamic model.

Further, after determining the motion data of the vehicle body and the tire normal load at the current moment, the vehicle body dynamics module is also configured to send the motion data of the vehicle body at the current moment to the upper planning module, to enable the upper planning module performing the vehicle simulation based on the motion data of the vehicle body at the current moment.

Further, after determining the motion data of the vehicle body and the tire normal load at the current moment, the vehicle body dynamics module is also configured to send the tire normal load at the current moment to the tire dynamics module; and the tire dynamics module is also configured to determine the tire translational force at the next moment based on the tire normal load at the current moment.

Further, the control instruction includes at least one of: a gear position, a driving pedal opening, a braking pedal opening, and a steering angle of a steering wheel.

Further, before determining the tire translational force at the current moment based on the control instruction and the motion data of the vehicle body and the tire normal load outputted by the vehicle body dynamics module at the previous moment, the tire dynamics module 301 and/or the vehicle body dynamics module 302 is also configured to convert the control instruction into a vehicle control parameter based on a preset calibration table of control parameters.

The vehicle control parameter includes driving torque and/or braking torque.

Further, when the tire translational force at the current moment is determined based on the control instruction issued by the upper planning module and the motion data of the vehicle body and the tire normal load outputted by the vehicle body dynamics module at the previous moment, the tire dynamics module 301 is configured to determine a tire motion parameter at the current moment based on the driving torque, the braking torque, a tire rotation radius, a tire pressure, and a velocity of the vehicle body and the tire normal load outputted by the vehicle body dynamics module at the previous moment; to determine a tire longitudinal sliding rate at the current moment based on the tire rotation radius, the tire motion parameter and the velocity of the vehicle body outputted by the vehicle body dynamics module at the previous moment, and determining a tire longitudinal force at the current moment based on the tire longitudinal sliding rate and the tire normal load outputted by the vehicle body dynamics module at the previous moment; and to determine a tire lateral slip angle at the current moment based on a tire wheelbase, the tire motion parameter and the vehicle body velocity outputted by the vehicle body dynamics module at the previous moment, and determining a tire lateral force at the current moment based on the tire lateral slip angle and the tire normal load outputted by the vehicle body dynamics module at the previous moment, The tire translational force includes the tire longitudinal force and the tire lateral force.

Further, when the motion data of the vehicle body and the tire normal load at the current moment are determined based on the control instruction and the tire translational force at the current moment, the vehicle body dynamics module 302 is also configured to determine an air resistance and an air resistance torque based on a wind speed and a tire wheelbase; to determine an acceleration of the vehicle body and a yaw angle acceleration of the vehicle body based on a vehicle rotating inertia, the air resistance, the air resistance torque and the tire translational force at the current moment outputted by the tire dynamics module; to determine the tire normal load based on the acceleration of the vehicle body, the yaw angle acceleration of the vehicle body, the tire wheelbase, the air resistance and the air resistance torque at the current moment; and to determine a motion parameter of the vehicle body based on the acceleration of the vehicle body and the yaw angle acceleration of the vehicle body.

The motion parameter of the vehicle body includes at least one of: the acceleration of the vehicle body, the velocity of the vehicle body, a position of the vehicle body, a yaw angle of the vehicle body, a yaw angle velocity of the vehicle body, and the yaw angle acceleration of the vehicle body.

Further, the vehicle body dynamics module 302 is also configured to transform the motion data of the vehicle body at the current moment from a first coordinate system employed by the vehicle body dynamics module to a second coordinate system employed by the upper planning module before sending the motion data of the vehicle body at the current moment to the upper planning module.

The above apparatus for simulating the vehicle may execute the method for simulating the vehicle according to any of embodiments of the disclosure, and has corresponding functional modules for executing the method for simulating the vehicle and beneficial effects corresponding to the method.

Embodiment Four

According to embodiments of the disclosure, the disclosure also provides an electronic device and a readable storage medium.

Figure 4:
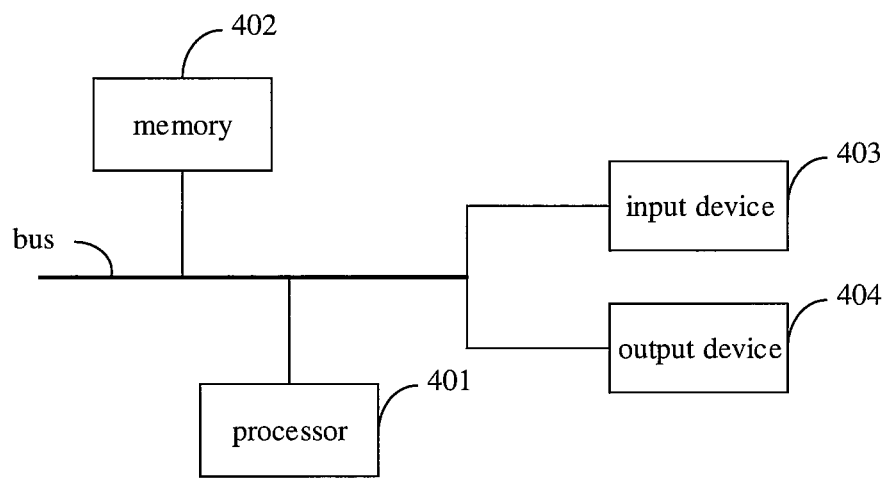
FIG. 4 is a block diagram illustrating an electronic device capable of implementing a method for simulating a vehicle according to embodiments of the disclosure.

As illustrated in FIG. 4, FIG. 4 is a block diagram illustrating an electronic device capable of implementing a method for simulating a vehicle according to embodiments of the disclosure. The electronic device aims to represent various forms of digital computers, such as a laptop computer, a desktop computer, a workstation, a personal digital assistant, a server, a blade server, a mainframe computer and other suitable computer. The electronic device may also represent various forms of mobile devices, such as personal digital processing, a cellular phone, a smart phone, a wearable device and other similar computing device. The components, connections and relationships of the components, and functions of the components illustrated herein are merely examples, and are not intended to limit the implementation of the disclosure described and/or claimed herein.

As illustrated in FIG. 4, the electronic device includes: one or more processors 401, a memory 402, and interfaces for connecting various components, including a high-speed interface and a low-speed interface. Various components are connected to each other via different buses, and may be mounted on a common main board or in other ways as required. The processor may process instructions executed within the electronic device, including instructions stored in or on the memory to display graphical information of the GUI (graphical user interface) on an external input/output device (such as a display device coupled to an interface). In other implementations, multiple processors and/or multiple buses may be used together with multiple memories if desired. Similarly, multiple electronic devices may be connected, and each device provides some necessary operations (for example, as a server array, a group of blade servers, or a multiprocessor system). In FIG. 4, a processor 401 is taken as an example.

The memory 402 is a non-transitory computer readable storage medium provided by the disclosure. The memory is configured to store instructions executable by at least one processor, to enable the at least one processor to execute the method for simulating the vehicle provided by the disclosure. The non-transitory computer readable storage medium provided by the disclosure is configured to store computer instructions. The computer instructions are configured to enable a computer to execute the method for simulating the vehicle provided by the disclosure.

As the non-transitory computer readable storage medium, the memory 402 may be configured to store non-transitory software programs, non-transitory computer executable programs and modules, such as program instructions/module (such as the tire dynamics module 301 and the vehicle body dynamics module 302 illustrated in FIG. 3) corresponding to the method for simulating the vehicle according to embodiments of the disclosure. The processor 401 is configured to execute various functional applications and data processing of the server by operating non-transitory software programs, instructions and modules stored in the memory 402, that is, implements the method for simulating the vehicle according to the above method embodiments.

The memory 402 may include a storage program region and a storage data region. The storage program region may store an application required by an operating system and at least one function. The storage data region may store data created according to predicted usage of the electronic device based on the semantic representation. In addition, the memory 402 may include a high-speed random access memory, and may also include a non-transitory memory, such as at least one disk memory device, a flash memory device, or other non-transitory solid-state memory device. In some embodiments, the memory 402 may optionally include memories remotely located to the processor 401, and these remote memories may be connected to the electronic device via a network. Examples of the above network include, but are not limited to, an Internet, an intranet, a local area network, a mobile communication network and combinations thereof.

The electronic device capable of implementing the method for detecting the mobile traffic light may also include: an input device 403 and an output device 404. The processor 401, the memory 402, the input device 403, and the output device 404 may be connected via a bus or in other means. In FIG. 4, the bus is taken as an example.

The input device 403 may receive inputted digital or character information, and generate key signal input related to user setting and function control of the electronic device capable of implementing the method for detecting the mobile traffic light, such as a touch screen, a keypad, a mouse, a track pad, a touch pad, an indicator stick, one or more mouse buttons, a trackball, a joystick and other input device. The output device 404 may include a display device, an auxiliary lighting device (e.g., LED), a haptic feedback device (e.g., a vibration motor), and the like. The display device may include, but be not limited to, a liquid crystal display (LCD), a light emitting diode (LED) display, and a plasma display. In some embodiments, the display device may be the touch screen.

The various implementations of the system and technologies described herein may be implemented in a digital electronic circuit system, an integrated circuit system, an application specific ASIC (application specific integrated circuit), a computer hardware, a firmware, a software, and/or combinations thereof. These various implementations may include: being implemented in one or more computer programs. The one or more computer programs may be executed and/or interpreted on a programmable system including at least one programmable processor. The programmable processor may be a special purpose or general purpose programmable processor, may receive data and instructions from a storage system, at least one input device, and at least one output device, and may transmit data and the instructions to the storage system, the at least one input device, and the at least one output device.

These computing programs (also called programs, software, software applications, or codes) include machine instructions of programmable processors, and may be implemented by utilizing high-level procedures and/or object-oriented programming languages, and/or assembly/machine languages. As used herein, the terms "machine readable medium" and "computer readable medium" refer to any computer program product, device, and/or apparatus (such as, a magnetic disk, an optical disk, a memory, a programmable logic device (PLD)) for providing machine instructions and/or data to a programmable processor, including a machine readable medium that receives machine instructions as a machine readable signal. The term "machine readable signal" refers to any signal for providing the machine instructions and/or data to the programmable processor.

To provide interaction with a user, the system and technologies described herein may be implemented on a computer. The computer has a display device (such as, a CRT (cathode ray tube) or a LCD (liquid crystal display) monitor) for displaying information to the user, a keyboard and a pointing device (such as, a mouse or a trackball), through which the user may provide the input to the computer. Other types of devices may also be configured to provide interaction with the user. For example, the feedback provided to the user may be any form of sensory feedback (such as, visual feedback, auditory feedback, or tactile feedback), and the input from the user may be received in any form (including acoustic input, voice input or tactile input).

The system and technologies described herein may be implemented in a computing system including a background component (such as, a data server), a computing system including a middleware component (such as, an application server), or a computing system including a front-end component (such as, a user computer having a graphical user interface or a web browser through which the user may interact with embodiments of the system and technologies described herein), or a computing system including any combination of such background component, the middleware components and the front-end component. Components of the system may be connected to each other via digital data communication in any form or medium (such as, a communication network). Examples of the communication network include a local area network (LAN), a wide area networks (WAN), and the Internet.

The computer system may include a client and a server. The client and the server are generally remote from each other and generally interact via the communication network. A relationship between the client and the server is generated by computer programs operated on a corresponding computer and having a client-server relationship with each other.

With embodiments of the disclosure, the tire translational force at the current moment is determined by the tire dynamics module based on the control instruction issued by the upper planning module and the motion data of the vehicle body and the tire normal load outputted by the vehicle body dynamics module at the previous moment. The motion data of the vehicle body and the tire normal load at the current moment are determined by the vehicle body dynamics module based on the control instruction and the tire translational force at the current moment. The motion data of the vehicle body at the current moment is used for vehicle simulation, and the tire normal load at the current moment is used to determine the tire translational force at the next moment. With the above technical solution, the control instruction issued by the upper planning module is processed by the tire dynamics module and the vehicle body dynamics module, data interaction is performed between the tire dynamics module and the vehicle body dynamics module, and then the tire translational force, the motion data of the vehicle body and the tire normal load are determined. In this way, the combination of the dynamic model and an existing integrated framework of the unmanned vehicle is realized. A complete closed loop is formed for a simulation test of the vehicle. The accuracy of a result of the simulation test of the vehicle is improved, and a matching degree between the result of the simulation test and a result of a road test is further improved. The simulation test may replace the road test when a new vehicle feature is introduced into the unmanned vehicle, thereby improving the test efficiency of the vehicle and reducing the test cost of the vehicle. Meanwhile, the vehicle body dynamics module and the tire dynamics module are configured to determine the tire translational force, the motion data of the vehicle body and the tire normal load respectively. Different dynamics modules perform operations respectively and complement each other at the same time, thereby implementing the decoupling between code segments in the dynamic model.

It should be understood that, steps may be reordered, added or deleted by utilizing flows in the various forms illustrated above. For example, the steps described in the disclosure may be executed in parallel, sequentially or in different orders, so long as desired results of the technical solution disclosed in the disclosure may be achieved, there is no limitation here.

The above detailed implementations do not limit the protection scope of the disclosure. It should be understood by the skilled in the art that various modifications, combinations, sub-combinations and substitutions may be made based on design requirements and other factors. Any modification, equivalent substitution and improvement made within the spirit and the principle of the disclosure shall be included in the protection scope of disclosure.

What is claimed is:

1. A method for simulating a vehicle, comprising:
   determining, by a tire dynamics module, a tire translational force at a current moment based on a control instruction issued by an upper planning module and motion data of a vehicle body and a tire normal load outputted by a vehicle body dynamics module at a previous moment; and
   determining, by the vehicle body dynamics module, motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment.

2. The method of claim 1, after determining the motion data of the vehicle body and the tire normal load at the current moment, further comprising:
   sending, by the vehicle body dynamics module, the motion data of the vehicle body at the current moment to the upper planning module, to enable the upper planning module performing the vehicle simulation based on the motion data of the vehicle body at the current moment.

3. The method of claim 2, before sending, by the vehicle body dynamics module, the motion data of the vehicle body at the current moment to the upper planning module, further comprising:
   transforming, by the vehicle body dynamics module, the motion data of the vehicle body at the current moment from a first coordinate system employed by the vehicle body dynamics module to a second coordinate system employed by the upper planning module.

4. The method of claim 1, after determining the motion data of the vehicle body and the tire normal load at the current moment, further comprising:
   sending, by the vehicle body dynamics module, the tire normal load at the current moment to the tire dynamics module; and
   determining, by the tire dynamics module, the tire translational force at the next moment based on the tire normal load at the current moment.

5. The method of claim 1, wherein the control instruction comprises at least one of: a gear position, a driving pedal opening, a braking pedal opening, and a steering angle of a steering wheel.

6. The method of claim 5, before determining the tire translational force at the current moment based on the control instruction and the motion data of the vehicle body and the tire normal load outputted by the vehicle body dynamics module at the previous moment, further comprising:
converting, by the tire dynamics module and/or the vehicle body dynamics module, the control instruction into a vehicle control parameter based on a preset calibration table of control parameters, the vehicle control parameter comprising driving torque and/or braking torque.

7. The method of claim 6, wherein determining the tire translational force at the current moment based on the control instruction issued by the upper planning module and the motion data of the vehicle body and the tire normal load outputted by the vehicle body dynamics module at the previous moment comprises:
determining a tire motion parameter at the current moment based on the driving torque, the braking torque, a tire rotation radius, a tire pressure, and a velocity of the vehicle body and the tire normal load outputted by the vehicle body dynamics module at the previous moment;
determining a tire longitudinal sliding rate at the current moment based on the tire rotation radius, the tire motion parameter and the velocity of the vehicle body outputted by the vehicle body dynamics module at the previous moment, and determining a tire longitudinal force at the current moment based on the tire longitudinal sliding rate and the tire normal load outputted by the vehicle body dynamics module at the previous moment; and
determining a tire lateral slip angle at the current moment based on a tire wheelbase, the tire motion parameter and the vehicle body velocity outputted by the vehicle body dynamics module at the previous moment, and determining a tire lateral force at the current moment based on the tire lateral slip angle and the tire normal load outputted by the vehicle body dynamics module at the previous moment,
wherein the tire translational force comprises the tire longitudinal force and the tire lateral force.

8. The method of claim 6, wherein determining the motion data of the vehicle body and the tire normal load at the current moment based on the control instruction and the tire translational force at the current moment comprises:
determining an air resistance and an air resistance torque based on a wind speed and a tire wheelbase;
determining an acceleration of the vehicle body and a yaw angle acceleration of the vehicle body based on a vehicle rotating inertia, the air resistance, the air resistance torque and the tire translational force at the current moment outputted by the tire dynamics module;
determining the tire normal load based on the acceleration of the vehicle body, the yaw angle acceleration of the vehicle body, the tire wheelbase, the air resistance and the air resistance torque at the current moment; and
determining a motion parameter of the vehicle body based on the acceleration of the vehicle body and the yaw angle acceleration of the vehicle body,
wherein the motion parameter of the vehicle body comprises at least one of: the acceleration of the vehicle body, the velocity of the vehicle body, a position of the vehicle body, a yaw angle of the vehicle body, a yaw angle velocity of the vehicle body, and the yaw angle acceleration of the vehicle body.

9. An apparatus for simulating a vehicle, comprising:
one or more processors;
a memory storing instructions executable by the one or more processors;
wherein the one or more processors are configured to:
determine a tire translational force at a current moment based on a control instruction issued by an upper planning module and motion data of a vehicle body and a tire normal load outputted by a vehicle body dynamics module at a previous moment; and
determine motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment.

10. The apparatus of claim 9, wherein the one or more processors are configured to:
send the motion data of the vehicle body at the current moment to the upper planning module, to enable the upper planning module performing the vehicle simulation based on the motion data of the vehicle body at the current moment.

11. The apparatus of claim 10, wherein the one or more processors are configured to:
transform the motion data of the vehicle body at the current moment from a first coordinate system employed by the vehicle body dynamics module to a second coordinate system employed by the upper planning module.

12. The apparatus of claim 9, wherein the one or more processors are configured to:
send the tire normal load at the current moment to the tire dynamics module; and
determining the tire translational force at the next moment based on the tire normal load at the current moment.

13. The apparatus of claim 9, wherein the control instruction comprises at least one of: a gear position, a driving pedal opening, a braking pedal opening, and a steering angle of a steering wheel.

14. The apparatus of claim 13, wherein the one or more processors are configured to:
convert the control instruction into a vehicle control parameter based on a preset calibration table of control parameters, the vehicle control parameter comprising driving torque and/or braking torque.

15. The apparatus of claim 14, wherein the one or more processors are configured to:
determine a tire motion parameter at the current moment based on the driving torque, the braking torque, a tire rotation radius, a tire pressure, and a velocity of the vehicle body and the tire normal load outputted by the vehicle body dynamics module at the previous moment;
determine a tire longitudinal sliding rate at the current moment based on the tire rotation radius, the tire motion parameter and the velocity of the vehicle body outputted by the vehicle body dynamics module at the previous moment, and determine a tire longitudinal force at the current moment based on the tire longitudinal sliding rate and the tire normal load outputted by the vehicle body dynamics module at the previous moment; and
determine a tire lateral slip angle at the current moment based on a tire wheelbase, the tire motion parameter and the vehicle body velocity outputted by the vehicle body dynamics module at the previous moment, and determine a tire lateral force at the current moment based on the tire lateral slip angle and the tire normal load outputted by the vehicle body dynamics module at the previous moment, wherein the tire translational force comprises the tire longitudinal force and the tire lateral force.

16. The apparatus of claim 14, wherein the one or more processors are configured to:
- determine an air resistance and an air resistance torque based on a wind speed and a tire wheelbase;
- determine an acceleration of the vehicle body and a yaw angle acceleration of the vehicle body based on a vehicle rotating inertia, the air resistance, the air resistance torque and the tire translational force at the current moment outputted by the tire dynamics module;
- determine the tire normal load based on the acceleration of the vehicle body, the yaw angle acceleration of the vehicle body, the tire wheelbase, the air resistance and the air resistance torque at the current moment; and
- determine a motion parameter of the vehicle body based on the acceleration of the vehicle body and the yaw angle acceleration of the vehicle body, wherein the motion parameter of the vehicle body comprises at least one of: the acceleration of the vehicle body, the velocity of the vehicle body, a position of the vehicle body, a yaw angle of the vehicle body, a yaw angle velocity of the vehicle body, and the yaw angle acceleration of the vehicle body.

17. A non-transitory computer readable storage medium having computer instructions stored thereon, wherein the computer instructions are configured to cause a computer to execute a method for simulating a vehicle, and the method comprises:
- determining, by a tire dynamics module, a tire translational force at a current moment based on a control instruction issued by an upper planning module and motion data of a vehicle body and a tire normal load outputted by a vehicle body dynamics module at a previous moment; and
- determining, by the vehicle body dynamics module, motion data of the vehicle body and a tire normal load at the current moment based on the control instruction and the tire translational force at the current moment, the motion data of the vehicle body at the current moment being used for vehicle simulation, and the tire normal load at the current moment being used to determine a tire translational force at a next moment.

18. The non-transitory computer readable storage medium of claim 17, after determining the motion data of the vehicle body and the tire normal load at the current moment, the method further comprising:
- sending, by the vehicle body dynamics module, the motion data of the vehicle body at the current moment to the upper planning module, to enable the upper planning module performing the vehicle simulation based on the motion data of the vehicle body at the current moment.

19. The non-transitory computer readable storage medium of claim 17, after determining the motion data of the vehicle body and the tire normal load at the current moment, the method further comprising:
- sending, by the vehicle body dynamics module, the tire normal load at the current moment to the tire dynamics module; and
- determining, by the tire dynamics module, the tire translational force at the next moment based on the tire normal load at the current moment.

20. The non-transitory computer readable storage medium of claim 17, wherein the control instruction comprises at least one of: a gear position, a driving pedal opening, a braking pedal opening, and a steering angle of a steering wheel.

* * * * *